Figure 1:
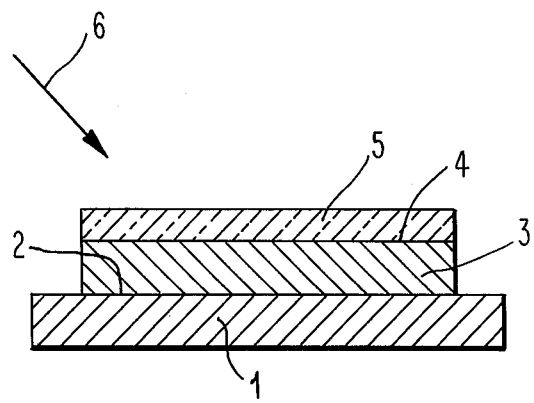

United States Patent [19]  [11] 4,173,497
Schmidt et al.  [45] Nov. 6, 1979

[54] AMORPHOUS LEAD DIOXIDE PHOTOVOLTAIC GENERATOR

[75] Inventors: Ferenc J. Schmidt, Ardmore; Jacob F. Betz, Quakertown, both of Pa.

[73] Assignee: Ametek, Inc., Paoli, Pa.

[21] Appl. No.: 929,352

[22] Filed: Jul. 31, 1978

Related U.S. Application Data

[63] Continuation-in-part of Ser. No. 827,939, Aug. 26, 1977, abandoned.

[51] Int. Cl.² ................... H01L 31/06; C25D 5/00
[52] U.S. Cl. ................... 136/89 SJ; 136/89 TF; 136/89 CU; 204/38 S; 204/57; 204/83; 357/2; 357/15; 357/30; 357/61
[58] Field of Search ......... 136/89 TF, 89 SJ, 89 CU; 357/2, 15, 30, 61; 252/62.3 V, 62.3 BT, 501; 204/40, 57, 83, 96, 38 S; 250/211 R, 211 J, 212; 29/572; 427/74

[56] References Cited

U.S. PATENT DOCUMENTS

| 2,872,405 | 2/1959 | Miller et al. | 204/290 |
| 2,883,305 | 4/1959 | Auwarter | 117/200 |
| 3,213,004 | 10/1965 | Schmidt | 204/29 |
| 3,294,660 | 12/1966 | Kingery et al. | 204/192 |
| 4,096,087 | 6/1978 | Bianchin et al. | 252/300 |
| 4,099,199 | 7/1978 | Wittry | 357/30 |
| 4,139,426 | 2/1979 | Schmidt | 204/57 |

OTHER PUBLICATIONS

A. B. Gancy, "Electrodeposition of Lead Dioxide from Alkaline Solution," *J. Electrochem. Soc.*, vol. 116, pp. 1496–1499, (1969).
S. Ikari et al., "Electrodeposited Lead Oxide," *J. Electrochem. Soc. Japan*, vol. 28, pp. E—150—E—152, (1960).
D. Adler, "Amorphous–Semiconductor Devices," *Scientific American*, pp. 36–48, (May 1977).
J. Burbank, "The Anodic Oxides of Lead," *J. Electrochem. Soc.*, vol. 106, pp. 369–376, (1959).
W. Mindt, "Electrical Properties of Electrodeposited PbO₂ Films," *J. Electrochem. Soc.*, vol. 116, pp. 1076–1080, (1969).

*Primary Examiner*—Aaron Weisstuch
*Attorney, Agent, or Firm*—Miller & Prestia

[57] ABSTRACT

Photovoltaic generator, comprised of photovoltaic amorphous lead dioxide with an oxygen to lead ratio in the range of 1.66 to 1.99, and having rectifying and ohmic junctions therewith. Said lead dioxide may be formed by electrodeposition on substrates, such as copper, nickel, stainless steel, carbon, brass, stannic oxide, indium oxide, and gold plated copper or brass, and generally provides an ohmic junction with the substrate. A rectifying photovoltaic junction of the Schottky barrier type is formed by overcoating the lead oxide with one or more of an evaporated, sputtered or ion plated film of copper, aluminum, Inconel[1], nickel, gold, platinum, palladium, nickel oxide, titanium, titanium oxide, and copper oxide.

[1]Trademark of International Nickel Co. Inc.

10 Claims, 2 Drawing Figures

AMORPHOUS LEAD DIOXIDE PHOTOVOLTAIC GENERATOR

This is a continuation-in-part of application Ser. No. 827,939, filed Aug. 26, 1977 and now abandoned, of common inventorship and assignment herewith.

This invention pertains to photovoltaic materials and more particularly to the use and method of manufacture of photovoltaic generators utilizing a family of compounds which may be manufactured at modest cost and which have not heretofore been known to be useful in photovoltaic devices or applications.

Materials which are known to generate an electrical current in response to incident light energy are well known. Generically, such materials are referred to as photovoltaic. Among the materials known to be photovoltaic are elemental semiconductors such as silicon and germanium, and compound semiconductors such as cadmium sulfide-copper sulfide, gallium arsenide and cuprous oxide.

Photovoltaic response has been reported for both PbO and $PbO_2$ (the response of the latter being about half of the former) in U.S. Pat. No. 2,883,305 to Auwärter and for PbO, $Pb_3O_4$ and $Pb_{12}O_{19}$ (with the latter reported to give superior results) by ITEK Corp. in reports to the National Science Foundation dated 12 May, 1975 and 19 Aug., 1975. All of these are presumed to be fairly common crystalline forms of lead oxide in view of the relatively recent discovery and much less common nature of amorphous lead dioxide. The first known report of amorphous lead dioxide in the literature is in the article *Electrodeposited Lead Oxide*—Ikari and Yoshizawa, Journal of the Electrochemical Society of Japan (Overseas Suppl. Ed.) Vol. 28, No. 7-9, E 150 (1960).

More recently, fundamental studies of the nature of amorphous materials have been undertaken in view of the realization that some amorphous materials, such as silicon, were useful in semiconductor applications, more particularly as photovoltaic materials. In this regard, see *Amorphous-Semiconductor Devices*—Adler, Scientific American, May, 1977, pages 36-48 and particularly the reference to the development of amorphous silicon solar cells in the middle column on page 42.

The characteristics and properties of lead oxides are discussed in general in *The Anodic Oxides of Lead*—Burbank, Journal of The Electrochemical Society, Vol. 106, No. 5, May 1959, pages 369-376 and *Electrical Properties of Electrodeposited $PbO_2$ Films*—Mindt, Journal of The Electrochemical Society, Vol. 116, No. 8, 1969, pages 1076-1080.

Because of the electronic characteristics of lead dioxide, with a band gap of approximately 1.5eV, one would expect this material to be at an optimum position for solar energy conversion by photovoltaic means. Moreover, lead dioxide has an additional advantage in that it is a fairly plentiful and relatively inexpenive material and may be conveniently formed in thin layers by the electrodeposition technique. Notwithstanding these inherent advantages of lead dioxide as a photovoltaic material, however, it has apparently not previously been found to be photovoltaic to any significant degree (with the exceptions noted above).

With this background in mind, it is the general objective of the present invention to utilize lead dioxide to provide a new photovoltaic material and improved photovoltaic generators based thereon.

More specifically, it is an object of the present invention to provide as a photovoltaic material, a class of compounds not previously reported to be photovoltaic, which compounds are relatively inexpensive and well adapted to manufacture in combination with other elements of common photovoltaic generators.

These objects and others which will be apparent in the course of the subsequent description of this invention, are met, briefly, by a photovoltaic material comprised of amorphous lead dioxide, in which the oxygen to lead ratio is generally in the range 1.66:1 to 1.9:1 and which may be conveniently formed by electrodeposition from a modified conventional plating bath.

The photovoltaic material of this invention is generally referred to as amorphous because it yields no significant x-ray diffraction pattern indicative of crystalline regularity in its structure. However, because it is formed by methods similar to those used in making crystalline forms of lead dioxide, it is believed that it may be related thereto in molecular structure, though obviously differing in some significant way.

The photovoltaic material of this invention may be formed by electrodeposition from an alkaline leadmonoxide bath containing a leveling agent. Two such known baths are (a) sodium hydroxide, lead monoxide and triethanolamine in solution and (b) sodium hydroxide, lead monoxide and sodium potassium tartrate in solution.

Figure 2:
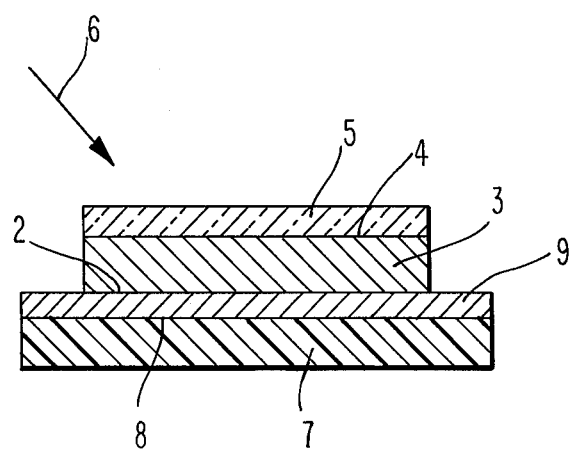

For a better understanding of this invention, reference may be made to the following detailed description thereof, including various specific examples, the appended claims and the accompanying drawings, in which:

FIG. 1 is a sectional view of a simple photovoltaic generator in accordance with the present invention; and FIG. 2 is a sectional view of a slightly modified form of the invention shown in FIG. 1.

Referring more specifically to FIG. 1, there is shown a photovoltaic generator consisting of substrate 1 (typically a conductive electrode or contact material, such as copper, stainless steel or brass) upon which is electrodeposited an amorphous lead dioxide coating 3 with a conducting or ohmic junction 2 therebetween. A thin partially transparent conductive (such as nickel, copper or gold) or semi-conductive (such as indium-tin oxide) outer layer 5 overlays lead oxide coating 3. The thin partially transparent outer layer 5 may be deposited by conventional means such as vacuum evaporation, sputtering or ion plating. In the typical embodiment of the present invention, junction 4 between thin partially transparent outer layer 5 and lead oxide coating 3 is of the Schottky barrier or rectifying type. Light 6 is incident on the device at its outer surface.

Still another embodiment of the invention is depicted in FIG. 2. In this embodiment, substrate 7 consists of an insulator or non-conductive material upon which a conductive (such as a metallic gold film) or semiconductive (such as titanium dioxide or stannic oxide) layer 9 is deposited by appropriate means, such as sputtering. The conductive or semiconductive layer 9 then acts as the conductive substrate 1 in the embodiment of FIG. 1 and the remaining junctions and elements of the embodiment shown in FIG. 2 are otherwise similar to those in FIG. 1.

In all of the above embodiments, conductive leads must be attached to the outermost conductive members or layers, 1 and 5 in FIGS. 1 and 9 and 5 in FIG. 2.

In accordance with conventional techniques, the power collection efficiency in the various embodiments of this invention may be improved by the utilization of conductive layers or materials disposed in a pattern on the outer surface of outer layer 5. For example, a metallic deposit in a comb or chevron-type pattern, serves as an electrical collector with relatively good conductivity while leaving uncovered a substantial portion of the underlying surface which is less conductive electrically but more transparent to incident light. Such a conductor pattern is sometimes referred to as "interdigitated".

As in conventional photovoltaic generators, the outer deposited conductive layer overlying the lead oxide must be very thin so as to be substantially transparent to incident light.

The present invention is based on the discovery of surprisingly good photovoltaic characteristics in amorphous, as distinguished from crystalline, lead dioxide. Like crystalline lead dioxide, of which amorphous lead dioxide is believed to be a related structure (notwithstanding the absence of any indication of significant regular structure therein by x-ray diffraction), photovoltaic amorphous lead dioxide compounds may have oxygen to lead ratios in the range of 1.66:1 to 1.99:1.

It has now been found that with sufficiently uniform deposition techniques, an amorphous form of lead dioxide can be formed and with care as to the smoothness and cleanliness of junction surface interfaces, photovoltaic characteristics can be observed with generators utilizing a wide variety of junction materials and manufacturing techniques and compositions.

The lead dioxide photovoltaic generators of the present invention have been prepared with lead dioxide thickness ranging from 1 to 500 micrometers. No upper limit to the allowable thickness of the lead dioxide is known. By contrast, in one series of tests of otherwise identical devices (gold film substrate, 125Å nickel Schottky barrier layer) and under the same conditions, no photovoltaic effect was observed using lead dioxide of either the $\alpha$ or $\beta$ crystalline form.

Initially, the amorphous lead oxide photovoltaic material used in the present invention was formed by electrodeposition from a plating solution consisting of 50 grams lead monoxide, 50 grams sodium hydroxide, 50 grams sodium potassium tartrate ($NaKC_4H_4O_6 \cdot 4H_2O$) and sufficient water to make 1 liter of solution. Lead dioxide was deposited from this solution on gold plated copper repeatedly over a period of several days, starting with a new substrate each time to demonstrate reproducibility, at a current density of 10 amps per square foot, a temperature of 70° C. and with mild magnetic stirring agitation. In these early experiments, the lead dioxide was deposited to a thickness of 25 micrometers (0.001 inch) and then ground using No. 400 Alundum abrasive and water on a ground glass plate. The polished surface was then rinsed with water and immersed in acetic acid for 5 minutes and rinsed with distilled water and dried. Subsequently, copper was evaporated onto the lead dioxide surface under vacuum to a thickness, such that 20% to 80% of the incident light was transmitted.

These specimens were connected to suitable instrumentation and when exposed to a light source, generated voltage and current under load which dropped instantly to 0 in total darkness. This could be repeated indefinitely.

In a one square centimeter test specimen, produced as above, with a copper overlayer sufficient to allow 60% light transmission and at a light intensity equivalent to sunlight (approximately 0.1 watt per square centimeter), the photogenerator was found to have an open circuit voltage of 110 millivolts. Under a 2500 ohm load, 0.022 milliamps current was generated at 55 millivolts ($1.21 \times 10^{-6}$ watt/per square centimeter).

In general, the deposition time for the formation of the lead dioxide photovoltaic coating depends on the thickness of coating desired and the current density employed in its preparation. At a current density of 20 amps per square foot, the deposition rate of lead oxide is 100 microns (approximately 0.004 inches) per hour. As an example, to deposit 5 micrometers of lead dioxide, one can plate at 1 amp per square foot for 1 hour or 10 amps per square foot for 6 minutes or any comparable combination. If the substrate is adequately prepared (cleaned, etc.) and satisfactory junctions are otherwise established, photovoltaic effects can be observed.

In other experiments, photovoltaic lead dioxide has been electrodeposited under conditions varying from one-half amp per square foot to 35 amps per square foot and temperature conditions from ambient to 85° C., and with agitation ranging from none to vigorous.

Also, other plating bath complexing chemical agents have been used in place of the sodium potassium tartrate used in the early reported experiments.

One other such bath is a formulation consisting of 0.5 to 25 grams triethanolamine, 50 grams sodium hydroxide, and 5 grams to saturation of lead monoxide all combined in water to yield one liter of plating solution.

As to alternative junction and support materials, nearly any electrically conductive material may be used as the support and electrode material. To date, photovoltaic properties have been observed in lead dioxide electrodeposited on gold, copper, platinum, nickel, stainless steel, carbon, brass, stannic oxide and indium oxide.

Likewise, while an evaporated copper layer overlying the lead dioxide was relied upon in the early experiments, subsequent work has led to the conclusion that the front or outer surface of the photovoltaic generators of this invention may consist of thinly deposited coatings of copper, nickel, gold, platinum, palladium, nickel oxide, titanium, and copper oxide. The materials have also been deposited by sputtering or ion plating.

Semi-conductor materials, such as titanium dioxide, stannic oxide and indium-tin oxide may also be used as the outer or upper layer.

The interface between the amorphous lead dioxide photovoltaic layer and the lower and upper layers may, as previously indicated, be either ohmic or rectifying. Whether it is one or the other usually depends on the method by which the two materials are produced and subsequently treated, or more specifically how one is deposited on the other. While it cannot be predicted a priori whether two materials will form a rectifying or ohmic junction, the production of one or the other types of these junctions are repeatable once determined by experimental investigation. It is thus entirely possible to have an ohmic junction with a gold substrate layer and a rectifying junction with a sputtered gold overlayer. That such differing types of junctions may be formed depending on material characteristics, method of forming, etc., is well known in the art of solar cells.

Also as in solar cells generally, the solar cells of this invention must include at least one rectifying or Schottky barrier at the interface with the photovoltaic amorphous lead dioxide.

While the amorphous lead dioxide photovoltaic material produced to date has generally been made by electrodeposition techniques, it is believed that such material may also be made by sputtering or other deposition techniques.

While this invention has been described with respect to particular formula, process conditions, manufacturing techniques, materials, and structures, it will be apparent that it is not limited thereto. The appended claims therefore are intended to encompass such variants and modifications of the invention which may become apparent to those skilled in the art and which are nevertheless within the true spirit and scope of the present invention.

Having thus described our invention in the form and embodiments now best known to us, we claim:

1. A photovoltaic generator comprising photovoltaic amorphous lead dioxide, having an oxygen to lead ratio in the range 1.66:1 to 1.99:1 interposed between conductive outer layers, through one of which said lead dioxide is exposed to incident light, said lead dioxide having a rectifying junction at its interface with one layer adjacent thereto and an ohmic junction with the other layer adjacent thereto.

2. A photovoltaic generator, as recited in claim 1, wherein one of said conductive layers is composed of gold, copper, platinum, nickel, stainless steel, carbon or brass.

3. A photovoltaic generator, as recited in claim 2, wherein the other conductive layer adjacent said lead dioxide is a semi-conductor which forms a rectifying junction at its interface with said lead dioxide.

4. A photovoltaic generator, as recited in claim 1, having a substantially transparent conductive or semi-conductive first layer adjacent said lead dioxide, a rectifying junction between said first layer and said lead dioxide, said first layer composed of copper, nickel, gold, platinum, palladium, nickel oxide, titanium, copper oxide, titanium dioxide, stannic oxide or indium-tin oxide, and a second conductive or semi-conductive layer adjacent said lead dioxide, an ohmic junction between said second layer and said lead dioxide, said second layer composed of platinum, nickel, stainless steel, carbon, brass, stannic oxide or indium oxide.

5. A photovoltaic generator, as recited in either of claim 1 or 2, wherein the other conductive layer adjacent said lead dioxide is a semi-conductor layer composed of titanium dioxide, stannic oxide or indium-tin oxide.

6. A method of making a photovoltaic generator comprising electrodepositing amorphous lead dioxide onto a conductive substrate which forms an ohmic junction therewith, and depositing a conductive or semi-conductor layer on said electrodeposited lead dioxide which forms a rectifying junction therewith.

7. A method, as recited in claim 6, wherein said lead dioxide is electrodeposited from a bath comprising triethanolamine, sodium hydroxide, and lead monoxide.

8. A method of producing a photovoltaic generator, as recited in claim 6, wherein said lead dioxide is electrodeposited from a bath including sodium potassium tartrate, sodium hydroxide and lead monoxide.

9. A method of making a photovoltaic generator, as recited in claim 6, wherein said lead dioxide is electrodeposited from a bath, consisting of an alkaline solution of lead monoxide and a leveling agent.

10. A photovoltaic generator formed by a process as recited in any one of claims 6 to 9.

* * * * *